(12) United States Patent
Kovacich et al.

(10) Patent No.: US 9,651,587 B2
(45) Date of Patent: May 16, 2017

(54) APPARATUS INCLUDING ELECTRODES, A RECTIFIER OR CIRCUIT, AND AN ILLUMINATED OR NON-ILLUMINATED INDICATOR FOR VISUAL INDICATION OF ENERGIZED ELECTRICAL CONDUCTORS

(71) Applicant: EATON CORPORATION, Cleveland, OH (US)

(72) Inventors: John Albert Kovacich, Waukesha, WI (US); Carl Anderson, Kenosha, WI (US); John Trublowski, Troy, MI (US); Steven Christopher Schmalz, Franklin, WI (US)

(73) Assignee: EATON CORPORATION, Cleveland, OH (US)

( * ) Notice: Subject to any disclaimer, the term of this patent is extended or adjusted under 35 U.S.C. 154(b) by 364 days.

(21) Appl. No.: 14/261,724

(22) Filed: Apr. 25, 2014

(65) Prior Publication Data
US 2015/0310719 A1    Oct. 29, 2015

(51) Int. Cl.
*G01R 19/155*    (2006.01)

(52) U.S. Cl.
CPC .................. *G01R 19/155* (2013.01)

(58) Field of Classification Search
CPC ...................................... G01R 19/155
USPC ...................... 324/133; 327/4, 63
See application file for complete search history.

(56) References Cited

U.S. PATENT DOCUMENTS

| | | | |
|---|---|---|---|
| 4,587,509 A | 5/1986 | Pitt et al. | |
| 4,616,207 A | 10/1986 | Knapp, Jr. et al. | |
| 5,065,142 A * | 11/1991 | Green | G01R 19/155 174/73.1 |
| 6,130,599 A | 10/2000 | Juds et al. | |
| 6,271,656 B1 | 8/2001 | Juds et al. | |
| 6,642,704 B2 | 11/2003 | Hastings et al. | |
| 6,731,105 B1 | 5/2004 | Hoyle et al. | |
| 7,145,322 B2 | 12/2006 | Solveson et al. | |
| 7,178,961 B2 * | 2/2007 | Janning | H05B 39/105 315/185 R |
| 2007/0007968 A1 | 1/2007 | Mauney Jr. et al. | |
| 2013/0076520 A1 * | 3/2013 | Kovacich | G01R 19/155 340/660 |
| 2013/0077368 A1 | 3/2013 | Kovacich et al. | |

OTHER PUBLICATIONS

Wikipedia, "Cockcroft-Walton generator", http://en.wikipedia.org/wiki/Cockcroft-Walton_generator, Jan. 19, 2014, 3 pp.
ABB, "VisiVolt™ Passive Voltage Indicator", Medium Voltage Products, www.abb.com, 2014, 2 pp.

\* cited by examiner

*Primary Examiner* — Brian Zimmerman
*Assistant Examiner* — Sara Samson
(74) *Attorney, Agent, or Firm* — Eckert Seamans; Stephen Bucchianeri; Philip Levy (57) ABSTRACT

An apparatus is for visual indication of an energized state of electrical conductors. The apparatus includes two electrodes structured to capacitively couple to two energized electrical conductors, respectively, in order to harvest an electric field. A rectifier is powered from one or both of the two electrodes. An illuminated indicator or a non-illuminated indicator is powered from the rectifier.

26 Claims, 5 Drawing Sheets

APPARATUS INCLUDING ELECTRODES, A RECTIFIER OR CIRCUIT, AND AN ILLUMINATED OR NON-ILLUMINATED INDICATOR FOR VISUAL INDICATION OF ENERGIZED ELECTRICAL CONDUCTORS

BACKGROUND

Field

The disclosed concept pertains generally to power bus apparatus and, more particularly, to power systems including an alternating current or direct current power bus. The disclosed concept also pertains to indicator apparatus for an alternating current or direct current power bus.

Background Information

Inside of electrical control centers, as well as other electrical environments, there are bus bar wiring conductors and lugged cable connection conductors, as well as conductor taps for three-phase power. This is true regardless whether the corresponding electrical product is for low voltage or for medium voltage.

Maintenance personnel can be harmed when accidentally touching energized surfaces of power bus bars.

Electrical sensors of various types are used to detect the current flowing through a conductor. Such sensors include, for example, a single Hall effect sensor that produces an output voltage indicative of the current magnitude as well as more conventional current sensors such as a shunt resistor or a current transformer.

Hall effect devices have been used to sense variations in magnetic flux resulting from a flow of current through a conductor. Some of these known devices have used a flux concentrator to concentrate magnetic flux emanating from the flow of current through the conductor. It has previously been suggested that electrical current sensing apparatus could be constructed in the manner disclosed in U.S. Pat. Nos. 4,587,509; and 4,616,207.

It is also known to measure the current in a conductor with one or two appropriately placed Hall sensors that measure flux density near the conductor and to convert the same to a signal proportional to current. See, for example, U.S. Pat. Nos. 6,130,599; 6,271,656; 6,642,704; and 6,731,105.

U.S. Pat. No. 7,145,322 discloses a power bus current sensor, which is powered by a self-powered inductive coupling circuit. A sensor senses current of the power bus. A power supply employs voltage produced by magnetically coupling the power bus to one or more coils, in order to power the sensor and other circuitry from flux arising from current flowing in the power bus.

U.S. Patent Application Pub. No. 2007/0007968 discloses a system for monitoring an electrical power system including one or more transducer units, each of which has a current measuring device and a voltage measuring device coupled to a respective one of the phase conductors of the power system, and a transducer wireless communications device. The transducer unit includes a battery for providing power to the components thereof. The battery is connected to a trickle charger, which, in turn, is electrically coupled to a phase conductor. The trickle charger is a known parasitic power charger that draws power from the phase conductor and uses it to charge the battery.

A known prior proposal for monitoring a bus bar wiring conductor employs a current transformer to harvest energy or an associated signal, through coupling to the magnetic field caused by current flowing through the conductor. However, if a load is not connected to the conductor, and, thus, no current is flowing, then a current transformer (or magnetic coupling) will not function.

U.S. Patent Application Pub. No. 2013/0076520 discloses an indicator system for an alternating current power bus. The system comprises: an electret operatively associated with the alternating current power bus, the electret comprising an output having an alternating current voltage when the alternating current power bus is energized; and an indicator comprising an input electrically interconnected with the output of the electret and an indication output responsive to the alternating current voltage of the output of the electret.

It is known to use LCD indicators for medium voltage power busses; however, it is believed that this technology is limited to nominal medium voltage levels since suitably high electric field levels are needed for proper operation.

There is room for improvement in indicator apparatus for a power bus.

SUMMARY

These needs and others are met by embodiments of the disclosed concept in which two electrodes capacitively couple to two energized electrical conductors, respectively, in order to harvest an electric field. A rectifier or other suitable circuit is powered from one or both of the two electrodes. An illuminated indicator or a non-illuminated indicator is powered from the rectifier or the other suitable circuit.

In accordance with one aspect of the disclosed concept, an apparatus for visual indication of an energized state of electrical conductors comprises: two electrodes structured to capacitively couple to two energized electrical conductors, respectively, in order to harvest an electric field; a rectifier powered from at least one of the two electrodes; and an illuminated indicator or a non-illuminated indicator powered from the rectifier.

As another aspect of the disclosed concept, an apparatus for visual indication of an energized state of electrical conductors comprises: two electrodes structured to capacitively couple to two energized electrical conductors, respectively, in order to harvest an electric field; a circuit powered from the two electrodes; and a non-illuminated indicator powered from the circuit, wherein the two energized electrical conductors are energized by a direct current voltage; and wherein the non-illuminated indicator is a contrast ratio indicator.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "low voltage" shall mean any alternating current (AC) voltage that is less than about 1000 $V_{RMS}$ (i.e., a low AC voltage), or any direct current (DC) voltage that is less than about 1500 VDC (i.e., a low DC voltage).

As employed herein, the term "medium voltage" shall mean nominal AC voltage greater than a low AC voltage and in the range from about 1 $kV_{RMS}$ to about 38 $kV_{RMS}$ (i.e., a medium AC voltage), or nominal DC voltage greater than a low DC voltage and in the range from about 1500 VDC to about 50 kVDC (i.e., a medium DC voltage).

As employed herein the term "switchgear device" shall expressly include, but not be limited by, a circuit interrupter, such as a circuit breaker (e.g., without limitation, low voltage or medium voltage or high voltage); a motor controller/starter; a busway; and/or any suitable device which carries or transfers current from one place to another.

As employed herein the term "power bus" shall mean a power conductor; a power bus bar; a power line; a power phase conductor; a power cable; and/or a power bus structure for a power source, a circuit interrupter or other switchgear device, or a load powered from the power bus.

The disclosed concept provides a safety feature to, for example, electrical control enclosures or assemblies (e.g., without limitation, motor control centers) with an illumination apparatus that visually indicates to a user (e.g., without limitation, maintenance worker; electrician; technician) that an electrical conductor has been energized (by an applied voltage, even though electrical current is not necessarily flowing therethrough or an electrical load is not necessarily electrically connected thereto).

The disclosed concept provides an electrode instead of an electret for capacitively coupling to harvest the electric field of a power bus and significantly reduce cost while still providing an indication of the power bus being energized.

Inside of electrical control centers and assemblies, there are bus run (e.g., riser and lateral bus; main bus) electrical conductors and lugged cable connection conductors, as well as conductor taps and insulated wiring for single-phase or three-phase power. This is true whether the electrical product is for low voltage or medium voltage. The disclosed concept provides a safety feature with an illumination or non-illumination apparatus by which a visual indication (through a lighted-brightness or a high-contrast indicator) signals that a given electrical conductor is energized, even though an electrical load may not be electrically connected thereto or that current may not be flowing therethrough. The disclosed concept makes use of the electric field that is generated in the space around the electrical conductor that is energized. This generated electric field is used to "turn-on" a suitable device or material that is susceptible to the electric field (e.g., without limitation, a gas phase electroluminescent (EL) device (e.g., without limitation, neon and/or neon-xenon gas-based EL devices) or EL material solution, such as a neon or neon-xenon gas mixture that electroluminesces in the electric field). The EL material solution could include those gas phase devices or solid state EL devices. For example, neon acts as an "open" in the circuit until it turns on.

The disclosed concept employs an electrode-based capacitively coupled apparatus to harvest the generated electric field rather than an electret device or system or an electret material solution. Since prior electret-based systems are relatively expensive and constitute a significant component of overall system cost, the disclosed concept provides both a performance improvement (e.g., without limitation, enables miniaturization since an electret must be dimensionally sized proportional to the desired voltage output; provides improved performance in relatively high moisture environments since the electret voltage can vary in these environments unless it is sealed (which costs more)) as well as a significant cost reduction over known prior proposals.

Figure 1:
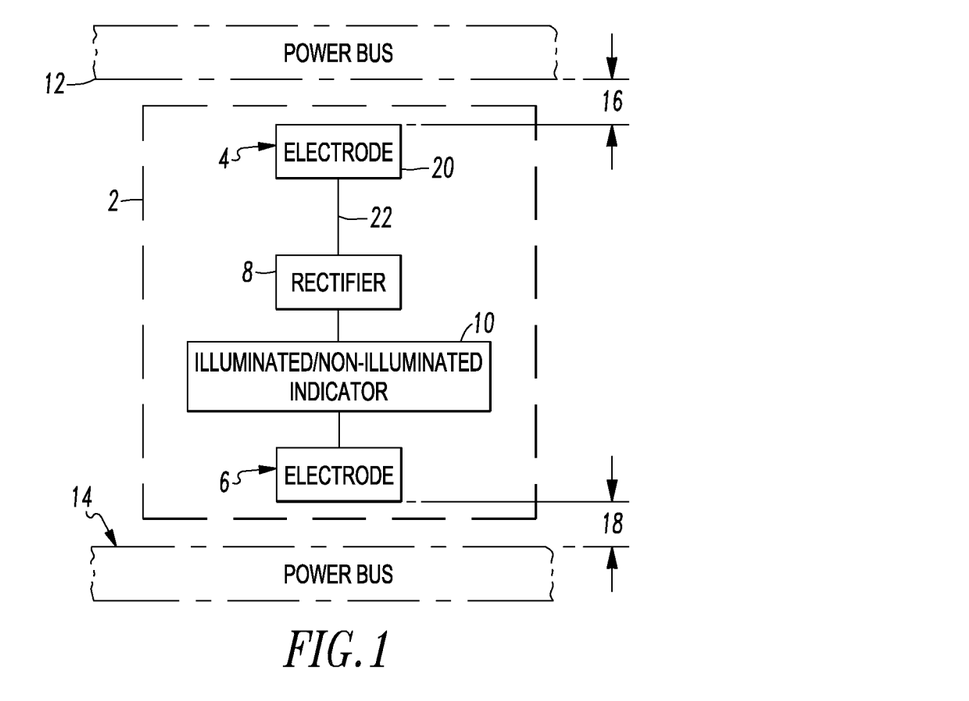
FIG. 1 is a block diagram of an apparatus for visual indication of an energized state of electrical conductors including two electrodes, a rectifier, and an illuminated or non-illuminated indicator in accordance with embodiments of the disclosed concept.

FIG. 1 shows an apparatus 2 for visual indication of an energized state of electrical conductors including two electrodes 4,6 (e.g., plate electrodes; a plate electrode and a wire electrode; a plate and a conductor/wire-shaped electrode), a rectifier 8 and an illuminated or non-illuminated indicator 10. The two electrodes 4,6 capacitively couple to two energized electrical conductors 12,14 (shown in phantom line drawing) (e.g., without limitation, power busses energized by AC or DC; a power bus bar; a power conductor), respectively, in order to harvest an electric field. The rectifier 8 is powered from at least one of the two electrodes 4,6. The illuminated indicator or non-illuminated indicator 10 is powered from the rectifier 8. The electrodes 4,6 are disposed within a suitable distance 16,18 of the electrical conductors 12,14, respectively.

For AC power busses, the electrode 4 includes an output having an AC voltage when the AC power bus 12 is energized. The electrode 4, when capacitively coupled to the adjacent energized AC power bus 12, interacts with the generated AC electric field of the power bus 12. The other electrode 6, when capacitively coupled to the other energized AC power bus 14, provides a localized, virtual circuit ground potential from which subsequent circuitry can be referenced (alternatively, DC+ and DC− power busses can be employed). The output DC voltage of the rectifier 8 then can act on the indicator 10.

The electrode 6, the rectifier 8 and the indicator 10 are electrically "floating" with respect to the power bus 14. None of this is directly electrically connected to ground potential or to the bus bar potential, such that the interaction is through the power bus AC electric field (i.e., capacitively coupling to a high side and a low side; through purposeful electrode coupling or through taking advantage of parasitic capacitive coupling; or a combination thereof). This capacitive coupling could be phase-to-phase, or phase-to-(virtual) ground; or it could be capacitive coupling from high side DC to low side DC, or high side DC to (virtual) ground. Any connection to a ground or a virtual ground is indirectly connected via capacitive coupling, not via a direct electrical connection—that is, through an explicit coupling electrode or in the case of energizing a very low voltage indicator type, through the capacitive coupling of the circuit wiring itself (i.e., taking advantage of parasitic capacitive coupling to the low side). Depending on the physical arrangement, there can be parasitic capacitive-coupling-to-ground that may be involved; if so, that capacitance should be tailored to meet the needs of the equivalent circuit. The electrode 6 is adjacent to or suitably proximate the power bus 14. The electrode 6 is not actually electrically connected to the power bus 14, although it may be suitably mechanically attached or coupled thereto.

For DC power busses, the electrode 4 includes an output having a DC voltage when the DC power bus 12 is energized.

EXAMPLE 1

The illuminated indicator or non-illuminated indicator 10 is selected from the group consisting of a neon indicator, an LED indicator, an OLED (organic LED) indicator, an LCD indicator, an electrochromic indicator, an electrophoretic indicator (e.g., an E INK® electrophoretic indicator; a SiPix® electrophoretic indicator), and a quantum dot indicator.

EXAMPLE 2

The illuminated indicator or non-illuminated indicator 10 can be an illuminated indicator, such as a gas phase electroluminescent device (e.g., without limitation, a neon indicator in series with a current limiting resistor).

EXAMPLE 3

The illuminated indicator or non-illuminated indicator 10 can be a non-illuminated indicator, such as a non-illuminated contrast ratio indicator, which can function for the electrical conductors 12,14 being energized by a suitable AC or DC voltage.

EXAMPLE 4

The illuminated indicator or non-illuminated indicator 10 can be an illuminated indicator, such as an illuminated gas (e.g., without limitation, neon) phase electroluminescent/ solid state electroluminescent indicator solution, such as an electroluminescent material solution (e.g., without limitation, a neon or neon-xenon gas mixture that electroluminesces in an electric field).

EXAMPLE 5

Further to Example 3, the non-illuminated contrast ratio indicator is structured to operate with the energized electrical conductors 12,14 being energized by a low voltage.

EXAMPLE 6

Figure 12:
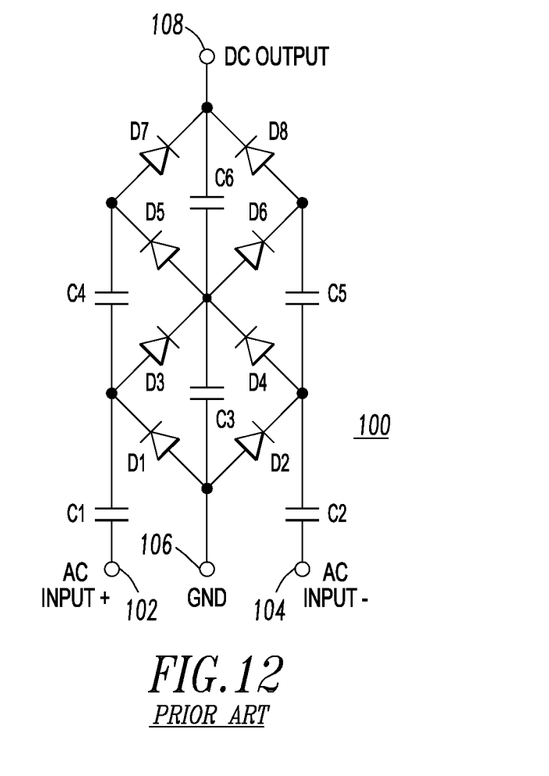
FIG. 12 is a block diagram of a conventional full-bridge, two-stage CW generator or voltage multiplier.

The rectifier 8 can be a half-bridge rectifier (e.g., without limitation, a number of diodes) or a half-bridge Cockcroft-Walton (CW) rectifier (not shown, but see the full-bridge, two-stage CW rectifier 100 of FIG. 12; a simple half-bridge, single-stage CW rectifier would include only diodes D1,D3 and capacitor C3). This example employs a single conductor electrical connection between the electrode 4 and the rectifier 8, a single conductor electrical connection between the rectifier 8 and the indicator 10, and a single conductor electrical connection between the indicator 10 and the electrode 6. The electrode 4 capacitively couples to the power bus 12, and the other electrode 6 capacitively couples to a ground or to an opposing pole at the other power bus 14.

The example half-bridge CW rectifier can be employed with a neon bulb and its series current limiting resistor as the example indicator 10. This and other CW circuits disclosed herein can be employed for a blinking neon bulb, in order to sufficiently harvest enough charge to turn-on the neon bulb. This and other CW circuits disclosed herein are not required for a contrast indicator, which employs a relatively much lower level of charge-induced potential difference (these devices "turn on" when the electrodes are at different potentials and there is no current flow (which allows them to stay "on" almost indefinitely)) to turn that device on.

In this example, the energy harvesting electrode 4 is a one-lead device, and only half of a full-bridge rectifier is needed (on a half-cycle by half-cycle basis), for example, for reduced cost and simplicity of implementation.

The actual second electrical input of the half-bridge CW rectifier is an air coupled, floating "ground" with respect to the power bus phase which is sensed. This could be an actual ground or it could be an adjacent phase for which the voltage is out of phase with the sensed phase. The out of phase condition creates a voltage differential with the sensed phase. Since there is a differential, it behaves like "ground" from the perspective of the rectifier 8. The second input is through capacitive coupling (through the air) to ground or to the opposite or different pole.

EXAMPLE 7

The rectifier 8 can be a full-bridge rectifier (e.g., without limitation, a conventional full-wave bridge include four diodes) or a full-bridge CW rectifier (see the full-bridge, two-stage CW rectifier 100 of FIG. 12; a simple full-bridge, single-stage CW rectifier would include only diodes D1,D2, D3,D4 and capacitor C3).

A suitable full-bridge rectifier or full-bridge CW rectifier (e.g., FIGS. 4 and 5) permits energy harvesting, half-cycle by half-cycle, on a continuous basis.

EXAMPLE 8

In this example, the two energized electrical conductors 12,14 of FIG. 1 are power bus bars energized by a medium voltage. Each of the electrodes 4,6 can be a combination of a plate electrode 20 and a wire electrode 22, which can be selected from a plurality of different wire-shaped electrodes having a plurality of different angles, extensions and bends in order to geometrically configure a corresponding capacitive coupling function to the corresponding electrical conductors 12,14. By suitable control of the dimensional size and location of the capacitive coupling plate electrode 20 combined with the geometry of the wire electrode 22 (e.g., diameter; length; angle; location) with respect to the power bus bar 12 or 14, these geometrical factors and the voltage of the power bus bar 12 or 14 determine the amount of energy available for the rectifier 8.

EXAMPLE 9

Further to Example 3, a color contrast function makes the non-illuminated indicator more visible for human factors impact and is determined by the color of the electrophoretic material.

EXAMPLE 10

The apparatus 2 of FIG. 1 is passive and derives power without a battery, current flow in the power busses, or a wired electrical connection to the two energized electrical conductors 12,14.

EXAMPLE 11

Figure 2:
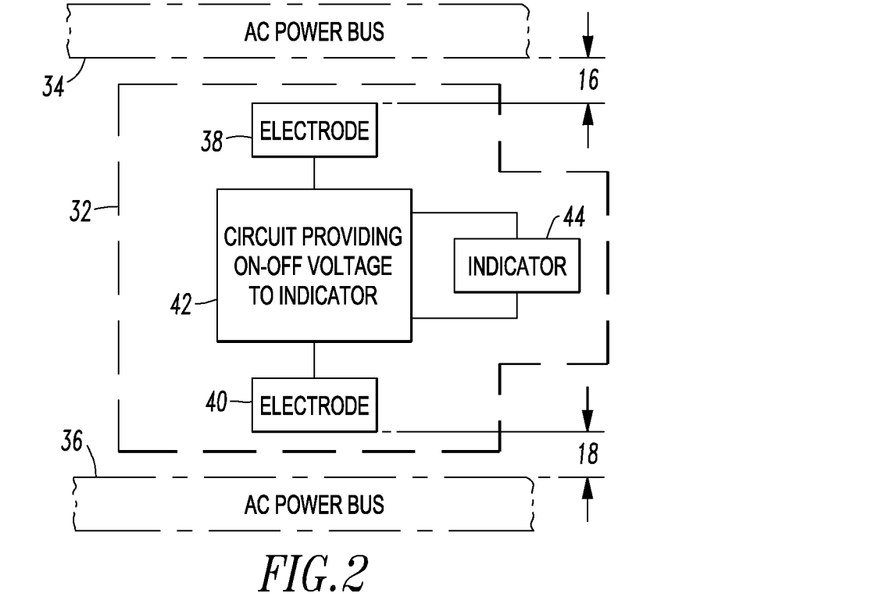
FIG. 2 is a block diagram of an alternating current (AC) apparatus for visual indication of an energized state of electrical conductors including two electrodes, a circuit providing on-off voltage, and an indicator in accordance with another embodiment of the disclosed concept.

FIG. 2 shows an example AC apparatus 32 for visual indication of energized electrical conductor 34,36 (shown in phantom line drawing) (e.g., without limitation, phases A and B; phases B and C; phases C and A; an AC power bus and ground). Somewhat similar to the apparatus 2 of FIG. 1, the apparatus 32 includes two electrodes 38,40, a circuit 42 providing on-off voltage, and an indicator 44. The main differences are that the rectifier 8 of FIG. 1 is replaced by the example circuit 42, and the energized electrical conductors 34,36 are only energized by an AC voltage in this example.

EXAMPLE 12

Figure 3:
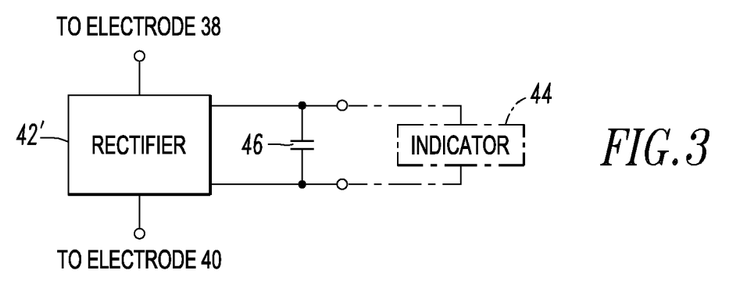
FIG. 3 is a block diagram of the circuit of FIG. 2 including a rectifier and a charging capacitor for the indicator in accordance with another embodiment of the disclosed concept.

FIG. 3 shows an example of the circuit 42 of FIG. 2 including a rectifier 42' and a charging capacitor 46 in parallel with the indicator 44 (shown in phantom line drawing in FIG. 3). Here, the indicator 44 can be, for example, a gas phase electroluminescent device, such as a neon bulb or a neon bulb in series with a current-liming resistor. This circuit provides a capacitively-coupled AC voltage, on the front-end, through a suitable half-bridge rectifier or half-bridge CW circuit, in order to provide DC to a capacitor-neon pair for blinking of the indicator 44. The rectifier 42' provides a heterodyne/beat function to blink the example neon contrast indicator.

EXAMPLE 13

Further to Example 12, the bus bar electrode 38 of FIG. 2 is electrically insulated from the AC bus bar 34 by a suitable insulator, such as insulated tape, which establishes the gap 16. This embodiment functions at relatively low AC voltages as well as at a range of medium AC voltages (e.g., without limitation, up to at least about 5 $kV_{RMS}$) with no dielectric breakdown.

EXAMPLE 14

Further to Example 13, and with reference to FIGS. 1-3, a wire electrode 22 (FIG. 1) (e.g., a wire conductor of about 3.5" to 4.0" in length and suitably bent at its mid-point) electrically connected to the top of a plate electrode 20 (FIG. 1) is not employed above about 700 $V_{RMS}$ and the example plate electrode 20 is about 2"×2"×1.5" in size. Above about 900 $V_{RMS}$, the example plate electrode 20 is reduced to about 1.5"×1.5"×1.5" in size. The blinking neon contrast indicator 44 (FIGS. 2 and 3) simply blinks at a relatively faster rate as the bus voltage increases.

The example blink rate can be controlled by the distance and the orientation of the wire electrode 22 (FIG. 1), and how the overall package size is reduced by the addition of the wire electrode 22, as shown by Examples 15-17.

EXAMPLE 15

For a 3.0 inch wire electrode 22 (FIG. 1), the following non-limiting example blink periods can be obtained: (1) aligned to bus bar axis/in-plane: 7.76 second blink period; (2) transverse/in-plane: 4.24 second blink period; and (3) aligned to bus bar axis/20 degrees up: 2.81 second blink period.

EXAMPLE 16

For a 3.5 inch wire electrode 22 (FIG. 1), the following non-limiting example blink periods can be obtained: (1) aligned to bus bar axis/in-plane: 3.93 second blink period; (2) transverse/in-plane: 3.24 second blink period; (3) aligned to bus bar axis/20 degrees up: 2.55 second blink period; (4) 45 degrees up/straight: 1.98 second blink period; and (5) 45 degrees up/bent at half-point: 2.38 second blink period.

EXAMPLE 17

For a 4.0 inch wire electrode 22 (FIG. 1), the following non-limiting example blink periods can be obtained: (1) aligned to bus bar axis/in-plane: 3.32 second blink period; (2) transverse/in-plane: 3.42 second blink period; (3) aligned to bus bar axis/20 degrees up: 2.28 second blink period; (4) 45 degrees up/straight: 1.65 second blink period; (5) 45 degrees up/bent at half-point: 1.89 second blink period; and (6) 45 degrees up/over top electrode/bent: 2.57 second blink period.

EXAMPLE 18

Further to Example 14, the example 2"×2" bus bar electrode 20 (FIG. 1) is a plate that is 2 inches by 2 inches. That bus bar electrode plate is placed in a parallel orientation to the AC bus bar 34 (FIG. 2), with the gap 16 that is a relatively short distance away from the AC bus bar 34. The relatively short distance gap 16 can be set, for example, by an insulating tape of relatively thin dimensions. The final 1.5" dimension refers to the distance that the "ground" capacitive coupling (through the air) electrode 40 (which is also placed in a parallel orientation to the AC bus bar 34) is placed away from the AC bus bar 34, measured from the bus bar. The top electrode 40 (which is the capacitive coupling, through the air to ground or the opposite pole, electrode) placement essentially dictates the height of the overall sensing apparatus 32. The electrode 38 is placed a relatively short distance or gap 16 away from the AC bus bar 34 (with the gap 16 being set by the insulating tape of relatively thin dimensions) and capacitively couples in energy from the AC bus bar 34 on the high (voltage) side.

EXAMPLE 19

Figure 4:
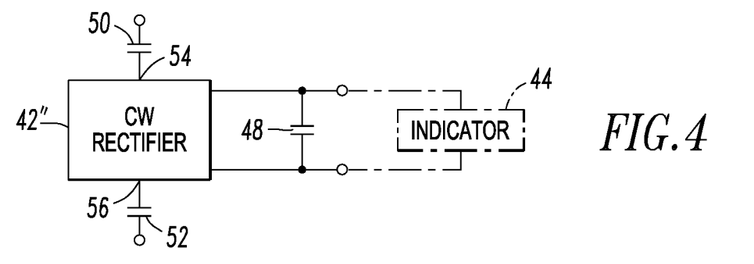
FIG. 4 is a block diagram of the circuit of FIG. 2 including two capacitors, a Cockcroft-Walton (CW) generator as a rectifier, and a charging capacitor for the indicator in accordance with another embodiment of the disclosed concept.

FIG. 4 shows an example of the circuit 42 of FIG. 2 including a single stage CW rectifier 42″, a charging capacitor 48 in parallel with the indicator 44 (shown in phantom line drawing in FIG. 4), and two additional capacitors 50,52. The CW rectifier 42″ includes a first AC input 54, a second AC input 56, a first capacitor 50 electrically connected between the electrode 38 (FIG. 2) and the first AC input 54, and a second capacitor 52 electrically connected between the other electrode 40 (FIG. 2) and the second AC input 56.

EXAMPLE 20

Figure 5:
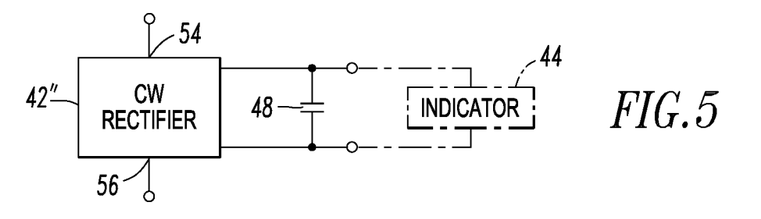
FIG. 5 is a block diagram of the circuit of FIG. 2 including a CW generator as a rectifier, and a charging capacitor for the indicator in accordance with another embodiment of the disclosed concept.

FIG. 5 shows an example of the circuit 42 of FIG. 2 including a single stage CW rectifier 42″ and a charging capacitor 48 in parallel with the indicator 44 (shown in phantom line drawing in FIG. 5). The two energized electrical conductors 34,36 (FIG. 2) are two bus bars energized by a low voltage. Each of the two electrodes 38,40 (FIG. 2) includes a capacitive coupling plate 20 (FIG. 1) disposed in a parallel orientation to a corresponding one of the two bus bars 34,36 and a wire-shaped electrode 22 (FIG. 1), the wire-shaped electrode 22 being electrically connected between the capacitive coupling plate 20 and a corresponding one of the first input 54 and the second input 56.

EXAMPLE 21

Further to Example 20, each of the electrodes 38,40 is formed from two plates (each being 2 inches by 2 inches) that are electrically connected to each other and stacked one right above the other in a parallel orientation (and in a parallel orientation to the bus bar 34 (FIG. 2)), where one of those two plates is at a distance from the bus bar 34 of 1.0 inches and the second of those two plates is at a distance from the bus bar 34 of 1.5 inches (where the overall sensor apparatus height is about 1.5 inches). This double plate arrangement acts as a single capacitive coupling electrode that is coupling through air to ground or to the opposite pole. This double plate arrangement can provide slightly improved capacitive coupling without needing to go to larger area plates.

EXAMPLE 22

Figure 6:
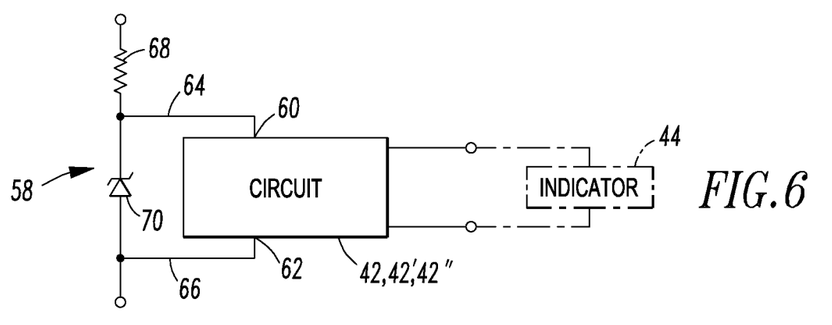
FIG. 6 is a block diagram of the circuits of FIGS. 2-4 including an over voltage protection circuit in accordance with another embodiment of the disclosed concept.

FIG. 6 shows an example of the circuits 42,42′,42″ of FIGS. 2-5 including an over voltage protection circuit 58. The circuits 42,42′,42″ include a first AC input 60, a second AC input 62, and the over voltage protection circuit 58 electrically connected between the two electrodes 38,40 (FIG. 2). The example over voltage protection circuit 58 includes a first output 64 electrically connected to the first AC input 60, a second output 66 electrically connected to the second AC input 62, a resistor 68, and a zener diode 70 from which the outputs 64,66 are derived.

EXAMPLE 23

Figure 7:
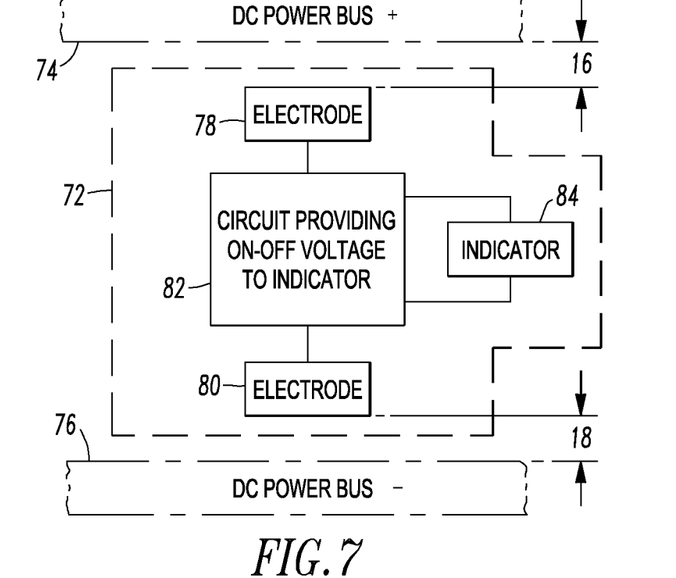
FIG. 7 is a block diagram of a direct current (DC) apparatus for visual indication of an energized state of electrical conductors including two electrodes and a circuit providing on-off voltage to an indicator in accordance with another embodiment of the disclosed concept.

FIG. 7 shows an example DC apparatus 72 for visual indication of energized electrical conductors 74,76 (shown in phantom line drawing) (e.g., without limitation, first (+) and second (−) DC power busses; a DC power bus and ground). Somewhat similar to the apparatus 2 (FIG. 1), the apparatus 72 includes two electrodes 78,80, a circuit 82 providing on-off voltage, and an indicator 84. The main differences are that the rectifier 8 of FIG. 1 is replaced by the example circuit 82, and the energized electrical conductors 74,76 are energized only by a DC voltage in this example.

The apparatus 72 provides a visual indication of an energized state of the two DC electrical conductors 74,76. The apparatus 72 includes two electrodes 78,80 structured to capacitively couple to the two energized electrical conductors 74,76, respectively, in order to harvest an electric field. The circuit 82 provides an on-off voltage to the indicator 84 and is powered from the two electrodes 78,80. The indicator 84 is a non-illuminated indicator (e.g., without limitation, an electrophoretic indicator) powered from the circuit 82. The two energized electrical conductors 74,76 are energized by a suitable DC voltage (e.g., without limitation, employed by or with photovoltaic systems or UPS/battery systems), and the non-illuminated indicator 84 is a contrast ratio indicator.

EXAMPLE 24

Figure 8:
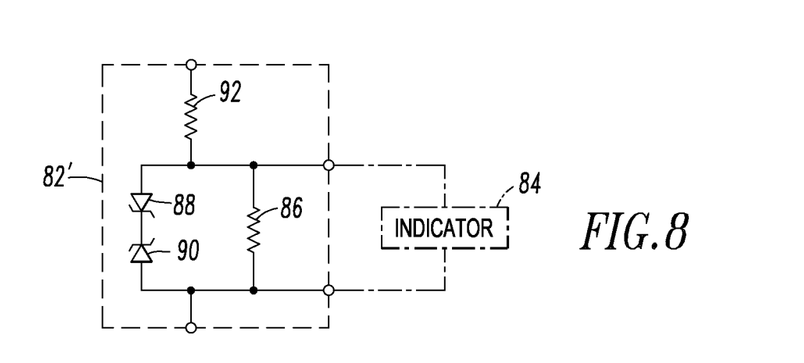
FIG. 8 is a block diagram of the circuit of FIG. 7 including a derivative generated pulse circuit in accordance with another embodiment of the disclosed concept.

FIG. 8 shows an example of the circuit 82 of FIG. 7, which is a derivative-generated pulse circuit 82′. The example circuit 82′ includes a first resistor 86 electrically connected in parallel with the indicator 84 (shown in phantom line drawing in FIG. 3), two series connected and polarity opposed zener diodes 88,90 with their cathodes being electrically connected together, and a second resistor 92. The series combination of the two polarity opposed zener diodes 88,90 is electrically connected in parallel with the first resistor 86 and the indicator 84. The second resistor 92 is electrically connected at one end to the electrode 78 (FIG. 7) and at the other end to the anode of the zener diode 88.

EXAMPLE 25

Figure 9:
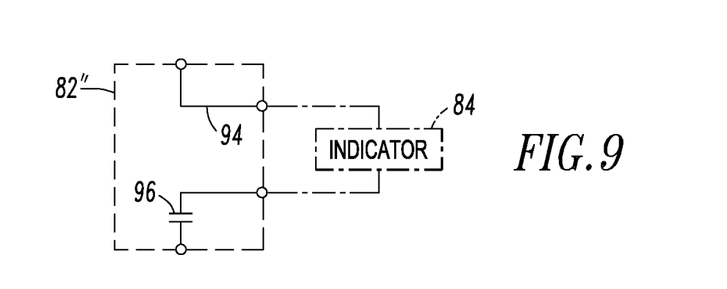
FIG. 9 is a block diagram of the circuit of FIG. 7 including a voltage reversing capacitor circuit in accordance with another embodiment of the disclosed concept.

FIG. 9 shows an example of the circuit 82 of FIG. 7, which is a voltage reversing capacitor circuit 82″. The example circuit 82″ includes a conductor 94 electrically connecting the electrode 78 (FIG. 7) to one side of the indicator 84 (shown in phantom line drawing) and a voltage reversing capacitor 96 electrically connecting the other electrode 80 (FIG. 7) to the other side of the indicator 84. The "reversing voltage" is the reverse in polarity of the voltage pulses applied to the indicator 84 to set the device to an ON or OFF state. The reverse in voltage is due to a mathematical derivative function exhibited by the series capacitor 96 due to the step (or inverse step) in the DC voltage applied to the indicator side of capacitor 96.

EXAMPLE 26

Figure 10:
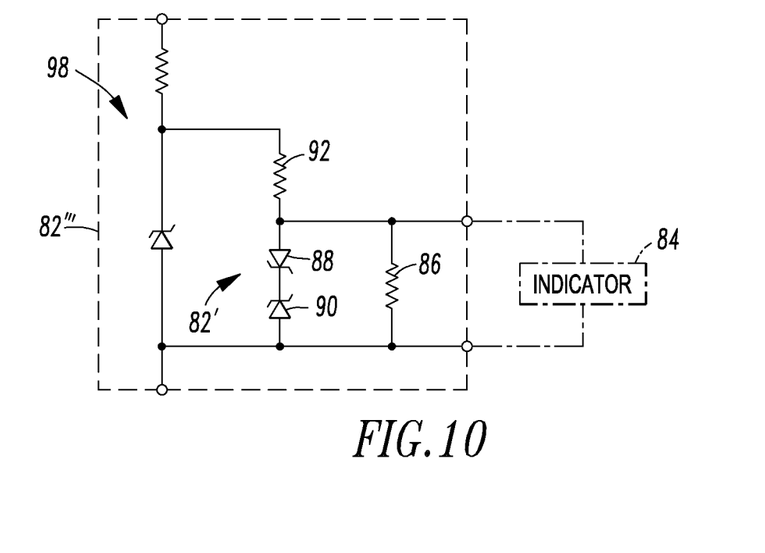
FIG. 10 is a block diagram of the circuit of FIG. 7 including an over voltage protection circuit and a derivative generated pulse circuit in accordance with another embodiment of the disclosed concept.

FIG. 10 shows an example of the circuit 82 of FIG. 7, which is a circuit 82‴ including the derivative-generated pulse circuit 82′ of FIG. 8 and an over voltage protection circuit 98, which is similar to the over voltage protection circuit 58 of FIG. 6.

EXAMPLE 27

Figure 11:
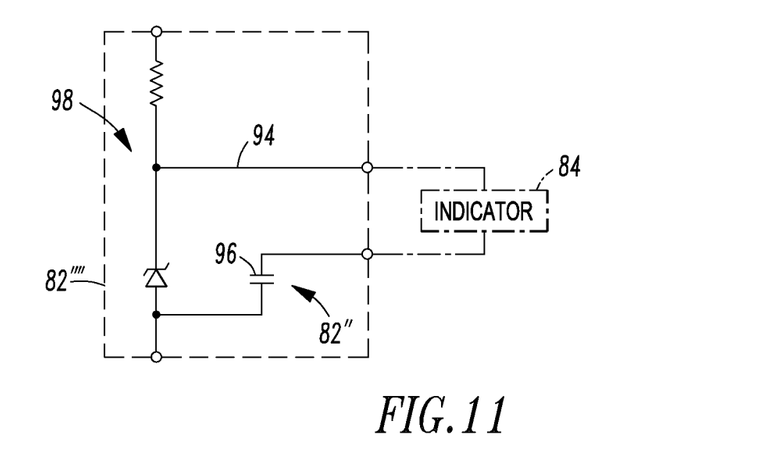
FIG. 11 is a block diagram of the circuit of FIG. 7 including an over voltage protection circuit and a voltage reversing capacitor circuit in accordance with another embodiment of the disclosed concept.

FIG. 11 shows an example of the circuit 82 of FIG. 7, which is a circuit 82⁗ including the over voltage protection circuit 98 of FIG. 10 and the voltage reversing capacitor circuit 82" including the conductor 94 and the capacitor 96 of FIG. 9.

EXAMPLE 28

FIG. 12 shows a conventional full-bridge, two-stage CW rectifier, generator or voltage multiplier 100. This circuit 100 includes a ladder network of two voltage multiplier stages using diodes D1,D2,D3,D4,D5,D6,D7,D8 and capacitors C1,C2,C3,C4,C5,C6. The purpose of the circuit 100 is to generate a suitably high DC voltage from an AC input signal at AC input terminals 102,104 using relatively few, low cost components. Fundamentally, the circuit 100 is a cascade of multiple stages (e.g., two example stages are shown) of a typical full-bridge rectifier (including diodes D1,D2,D3,D4 and capacitor C3). An AC voltage applied across the AC input terminals 102,104 is rectified to DC, thereby charging capacitor C3 to a voltage equal to the peak AC voltage minus the sum voltage of two forwardly biased diodes (e.g., without limitation, about 1.4 volts for silicon diodes). During the positive AC sinusoidal half-cycle, diodes D2 and D3 are forward biased and conduct current, while diodes D1 and D4 are reversed biased and block current flow. During the negative AC sinusoidal half-cycle, D1 and D4 are forward biased, while diodes D2 and D3 are reversed biased, resulting in charging C3 in the same polarity as during the positive half cycle. With the addition of optional capacitors C1 and C2, common mode DC voltage between the AC input terminals 102,104 and the GND circuit reference 106 can be achieved. This is important for proper circuit operation if the AC source and the DC derived voltage need to share a common or related reference, for example earth.

With the addition of a cascaded second stage including diodes D5,D6,D7,D8 and capacitors C4,C5,C6, as shown in FIG. 12, a charge multiplying or "pumping" effect will result in boosting the DC output voltage to the DC output 108 above that of a single stage circuit. The coupling of the AC source voltage through the combination series strings of C1 and C4, and C2 and C5, respectively, allows for the second full-bridge rectifier stage diodes D5,D6,D7,D8 to charge capacitor C6 in a similar fashion as was described for capacitor C3. The resulting electrically connected series combination of capacitors C3 and C6 results in essentially a doubling of the voltage compared to a single stage full-wave rectifier described previously. Persons of ordinary skill in the art will recognize that additional stages (not shown) can be added to achieve DC output voltages that nearly equal integral multiples of the peak AC source voltage, limited by losses due to component charge leakage and resistive dissipation.

In accordance with the disclosed concept, a suitable CW multiplier circuit, such as 100, can be used to rectify the AC voltage generated by an electrode, such as 38 of FIG. 2, to effectively accumulate charge on one or multiple capacitors and boost the voltage to a sufficient level to exceed the breakdown voltage of an indicator, such as 44 (e.g., without limitation, a neon lamp). This can be employed in combination with a suitable electrode 38 (e.g., a plate electrode or a plate electrode and a wire conductor) capacitively coupled to the energized electrical conductor 34 in order to harvest an electric field.

EXAMPLE 29

Figure 13:
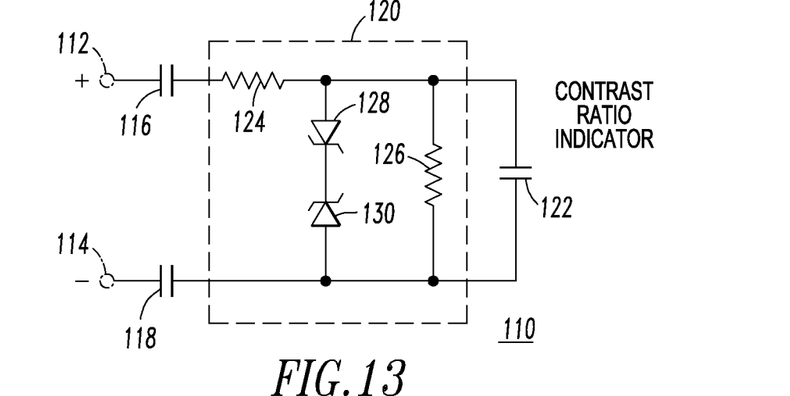
FIG. 13 is a block diagram of an apparatus for visual indication of an energized electrical conductor including two electrodes, an on-off pulse generation circuit for an electrophoretic indicator for application and removal of DC voltage, and an electrophoretic indicator in accordance with another embodiment of the disclosed concept.

FIG. 13 shows an apparatus 110 for visual indication of energized DC electrical conductors 112,114 (shown in phantom line drawing). The apparatus 110 includes two electrodes formed by air capacitors 116,118, an on-off derivative-generated pulse circuit 120 for application and removal of DC voltage, and a contrast ratio indicator, such as an example electrophoretic indicator 122. The air capacitors 116,118 provide isolation between the DC power busses 112,114 and the electrophoretic indicator 122.

This apparatus 110 includes one or both of the air capacitors 116,118 electrically connected in series with a resistor 124, which is in turn electrically connected in series with a parallel network of the electrophoretic indicator 122, another resistor 126, and two polarity opposed zener diodes 128,130. When an instantaneous DC voltage step is applied to the input of the apparatus 110, the air capacitor(s) 116,118 convey the DC voltage via the series resistor 124 to the electrophoretic indicator 122, thereby setting the device to its indicating (i.e., ON) state. This occurs because physics dictates that voltage across a capacitor, such as 116 and/or 118, cannot change instantaneously and mathematically is equivalent to the derivative of the DC step voltage input and appears as a peak pulse as a function of time. As time passes, and the input DC voltage remains constant, the capacitor(s) 116 and/or 118 charge to a voltage equal to the input voltage due to the current conduction of the series resistor 124 and the resistor 126 in parallel with the electrophoretic indicator 122. Once the air capacitors 116,118 are charged (current no longer flowing in the resistors 124,126), the resulting voltage on the electrophoretic indicator 122 equals zero, thereby retaining the set state of the device. When the input DC voltage instantaneously reverts to zero volts (an inverse step response), as what would happen if a DC power supply is de-energized, a derivative pulse is generated in similar fashion as when the positive DC voltage was applied, except now the pulse applied to the electrophoretic indicator 122 has a negative polarity. This negative voltage pulse resets the device to its non-indicating (i.e., OFF) state. The two polarity opposed zener diodes 128,130 serve as over voltage protection devices, protecting the electrophoretic indicator 122 from damage which may be caused by excessive voltage levels of either positive or negative polarity.

The apparatus 110, which provides on-off control through a derivative-generated pulse to the electrophoretic indicator 122, includes a network of relatively low cost components that provides a positive and negative pulse voltage to the electrophoretic indicator 122 to set and reset the opacity of the indicator. The air capacitor 116 is employed to couple the pulse derivation circuit to the DC source being monitored. If necessary, the second air capacitor 118 may be employed to provide common mode isolation, typically desired in most high voltage DC applications.

When an instantaneously positive or quickly rising voltage is applied to the DC power busses 112 (+) and 114 (−) as would occur when a DC power supply is energized, an exponentially decaying positive voltage pulse is applied to the electrophoretic indicator 122 as determined by the RRC network including resistors 124,126 and the capacitance of the electrophoretic indicator 122. The resulting positive voltage pulse "sets" the electrophoretic opacity to one state and is held in that state after the pulse decays to zero volts. In an analogous fashion, to a positive source voltage application, when an instantaneously negative or quickly falling voltage is applied to the DC power busses 112 (+) and 114 (−), as would occur when a DC power supply is de-energized, an exponentially decaying negative voltage pulse is applied to the electrophoretic indicator 122. The resulting negative voltage pulse "resets" the electrophoretic opacity to another state and is held in that state after the pulse decays to zero volts.

Furthermore, the anti-series combination of the zener diodes 128,130 configured in parallel with the electrophoretic indicator 122 serve to limit the maximum possible voltage applied thereto. In this instance, the series combination of the zener diodes 128,130 allows for a relatively higher negative amplitude voltage (e.g., without limitation, the maximum voltage of either polarity would be the sum of the zener breakdown voltage of one of the zener diodes 128,130 plus the forward bias voltage of the other one of the zener diodes 128,130) applied to the electrophoretic indicator 122.

For example and without limitation, when the DC voltage is turned on, the electrophoretic indicator 122 turns black, and when the DC voltage is turned off, the electrophoretic indicator 122 turns white.

EXAMPLE 30

FIGS. 6, 10 and 11 show examples including an over voltage protection circuit 58 or 98 including a zener diode for a contrast ratio-type electrophoretic indictor. The example circuit 58 is driven by a capacitive coupling circuit and protects from over voltage conditions. As shown in FIG. 6, the circuit 58 includes the zener diode 70 and the current limiting resistor 68 to limit the maximum voltage applied to an electrophoretic indicator, thereby eliminating possible damage thereto. The DC output voltage derived from the energy harvesting circuit of FIG. 2 is applied to the terminals of the circuits 42,42',42" as Vin. For input voltages less than the reverse breakdown voltage of the zener diode 70, the voltage at the output terminals to the indicator 44 as Vout equals Vin minus the voltage drop across the resistor 68 as dictated by Ohms law. Since an electrophoretic indicator exhibits fundamentally a capacitive impedance, after a certain time period, the current through the resistor 68 is negligible, resulting in Vin=Vout. After the voltage Vin minus the resistor voltage drop exceeds the zener breakdown voltage, the zener diode 70 begins to conduct, thereby limiting the maximum voltage allowable at output Vout, which is applied to the electrophoretic indicator.

In a similar fashion, when the input voltage Vin is negative, the zener diode 70 is forward biased and operates similar to a standard rectifier, thereby limiting the output voltage Vout to the negative of the forward bias voltage (e.g., without limitation, about −0.7 volts for a silicon zener diode). Persons of ordinary skill in the art will appreciate that the value of the resistor 68 and the power rating of both the resistor 68 and the zener diode 70 are suitably chosen for a particular application and the expected voltage and available source current levels.

EXAMPLE 31

For the examples of FIGS. 7-11 and 13, electrophoretic differentiation employs a passive circuit that is electrically isolated from the power busses 74,76 (FIG. 7). There is essentially no heat dissipation provided by the example ultralow power indicator 84. Other known indicator technologies need batteries or other sources of power. For example, known technologies employing an electret device harvest power from an electric field through use of the electret device, which is an alternate source of power.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An apparatus for visual indication of an energized state of electrical conductors, said apparatus comprising:
   two electrodes structured to capacitively couple to two energized electrical conductors, respectively, in order to harvest an electric field;
   a rectifier powered from both of said two electrodes; and
   an illuminated indicator or a non-illuminated indicator powered from said rectifier.

2. The apparatus of claim 1 wherein said rectifier is a Cockroft-Walton rectifier.

3. The apparatus of claim 1 wherein said illuminated indicator is an illuminated gas phase electroluminescent/ solid state electroluminescent indicator solution or a gas phase electroluminescent device.

4. The apparatus of claim 3 wherein said rectifier is structured to blink said gas phase electroluminescent device.

5. The apparatus of claim 3 wherein said illuminated gas phase electroluminescent/solid state electroluminescent indicator solution is an electroluminescent material solution.

6. The apparatus of claim 1 wherein said non-illuminated indicator is a non-illuminated contrast ratio indicator.

7. The apparatus of claim 6 wherein said non-illuminated contrast ratio indicator is structured to operate with said energized electrical conductors being energized by a low voltage.

8. The apparatus of claim 1 wherein said illuminated indicator or said non-illuminated indicator are selected from the group consisting of a neon indicator, an LED indicator, an OLEO indicator, an LCD indicator, an electrochromic indicator, an electrophoretic indicator, and a quantum dot indicator.

9. The apparatus of claim 8 wherein said non-illuminated indicator is a non-illuminated contrast ratio indicator.

10. The apparatus of claim 1 wherein said energized electrical conductors are energized by an alternating current voltage; and wherein said non-illuminated indicator is a contrast ratio indicator.

11. The apparatus of claim 10 wherein said rectifier comprises a charging capacitor in parallel with said indicator.

12. An apparatus for visual indication of an energized state of electrical conductors, said apparatus comprising:
   two electrodes structured to capacitively couple to two energized electrical conductors respectively in order to harvest an electric field;
   a rectifier powered from at least one of said two electrodes; and
   an illuminated indicator or a non-illuminated indicator powered from said rectifier,
   wherein said energized electrical conductors are energized by an alternating currant voltage,
   wherein said non-illuminated indicator is a contrast ratio indicator, and
   wherein said rectifier is a Cockroft-Walton rectifier comprising a first alternating current input, a second alternating current input, a first capacitor electrically connected between a first one of said two electrodes and said first alternating current input, and a second capacitor electrically connected between a second one of said two electrodes and said second alternating current input.

13. The apparatus of claim 10 wherein said rectifier comprises a first alternating current input, a second alternating current input, and an over voltage protection circuit electrically connected between said two electrodes, said over voltage protection circuit including a first output electrically connected to the first alternating current input and a second output electrically connected to the second alternating current input.

14. The apparatus of claim 1 wherein said rectifier comprises a first input and a second input; wherein said two energized electrical conductors are two bus bars energized by a low voltage; and wherein each of said two electrodes comprises a capacitive coupling plate disposed in a parallel orientation to a corresponding one of said two bus bars and a wire-shaped electrode, said wire-shaped electrode being electrically connected between said capacitive coupling plate and a corresponding one of said first input and said second input.

15. The apparatus of claim 14 wherein said wire-shaped electrode is selected from a plurality of different wire-shaped electrodes having a plurality of different angles, extensions and bends in order to geometrically configure a corresponding capacitive coupling function.

16. The apparatus of claim 1 wherein said two energized electrical conductors are energized by a medium voltage; and wherein each of said two electrodes comprises a capacitive coupling plate electrode.

17. The apparatus of claim 1 wherein said apparatus is passive and derives power without a battery or a wired electrical connection to said two energized electrical conductors.

18. The apparatus of claim 1 wherein said rectifier is half-bridge rectifier.

19. The apparatus of claim 1 wherein said rectifier is full-bridge rectifier.

20. An apparatus for visual indication of an energized state of electrical conductors, said apparatus comprising:
two electrodes structured to capacitively couple to two energized electrical conductors, respectively, in order to harvest an electric field;
a circuit powered from said two electrodes; and
a non-illuminated indicator powered from said circuit,
wherein said two energized electrical conductors are energized by a direct current voltage; and
wherein said non-illuminated indicator is a contrast ratio indicator.

21. The apparatus of claim 18 wherein said circuit comprises an over voltage protection circuit.

22. The apparatus of claim 20 wherein said circuit comprises a derivative-generated pulse circuit.

23. The apparatus of claim 20 wherein said circuit comprises an over voltage protection circuit and a derivative-generated pulse circuit.

24. The apparatus of claim 20 wherein said circuit comprises a voltage reversing capacitor circuit.

25. The apparatus of claim 20 wherein said circuit comprises a derivative-generated pulse circuit with air capacitors for isolation.

26. The apparatus of claim 20 wherein said circuit is an on-off pulse generation circuit; and wherein said contrast ratio indicator is an electrophoretic indicator controlled by said on-off pulse generation circuit.

* * * * *